(12) United States Patent
Dellmann et al.

(10) Patent No.: US 7,486,847 B1
(45) Date of Patent: Feb. 3, 2009

(54) CHIP CARRIER PACKAGE WITH OPTICAL VIAS

(75) Inventors: Laurent A. Dellmann, Adliswil (CH); Folkert Horst, Zurich (CH); Bert J. Offrein, Schoenenberg (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/059,858

(22) Filed: Mar. 31, 2008

(51) Int. Cl.
*G02B 6/12* (2006.01)

(52) U.S. Cl. .............................. 385/14; 385/31; 385/49; 385/88; 385/92

(58) Field of Classification Search .................. 385/8, 385/14, 15, 31, 32, 39, 53, 88, 92, 115, 123, 385/129, 130, 131, 132, 49; 361/679, 686, 361/752, 783; 257/81, 84, 678
See application file for complete search history.

(56) References Cited

U.S. PATENT DOCUMENTS

| | | | | |
|---|---|---|---|---|
| 4,732,446 | A * | 3/1988 | Gipson et al. .................. | 385/24 |
| 4,972,050 | A * | 11/1990 | Hammond et al. ........... | 174/251 |
| 6,181,863 | B1 * | 1/2001 | Engberg et al. .............. | 385/136 |
| 6,229,712 | B1 | 5/2001 | Munoz-Bustamante et al. .......................... | 361/783 |
| 6,343,164 | B1 | 1/2002 | Robertsson et al. ............ | 385/14 |
| 6,623,177 | B1 | 9/2003 | Chilton ........................ | 385/88 |
| 6,839,476 | B2 | 1/2005 | Kim et al. ...................... | 385/14 |
| 6,845,184 | B1 | 1/2005 | Yoshimura et al. ............. | 385/14 |
| 7,058,247 | B2 | 6/2006 | Crow et al. .................... | 385/14 |
| 7,136,551 | B2 | 11/2006 | Cho et al. ..................... | 385/31 |
| 7,149,376 | B2 * | 12/2006 | Uchida et al. ................ | 385/15 |
| 7,263,248 | B2 | 8/2007 | Windover .................... | 385/14 |
| 2003/0210869 | A1 | 11/2003 | Van Doorn ................... | 385/53 |
| 2003/0235377 | A1 | 12/2003 | Miyokawa et al. ............ | 385/92 |
| 2004/0151419 | A1 | 8/2004 | Parker .......................... | 385/14 |
| 2004/0264838 | A1 * | 12/2004 | Uchida et al. ................ | 385/14 |
| 2005/0104178 | A1 | 5/2005 | McFarland et al. .......... | 257/678 |
| 2006/0022289 | A1 | 2/2006 | Badhei et al. ............... | 257/432 |
| 2006/0198589 | A1 | 9/2006 | Sako et al. ................... | 385/123 |

(Continued)

FOREIGN PATENT DOCUMENTS

JP          2000-387190          5/2002          ............... 385/14 X

OTHER PUBLICATIONS

"High-Efficiency and Stable Optical Transmitter Using VCSEL-Direct-Bonded Connector for Optical Interconnection", Do-Won Kim, Tae-Woo Lee, Mu Hee Cho and Hyo-Hoon Park; *Optics Express* v15, n24, Nov. 26, 2007.

(Continued)

*Primary Examiner*—Brian M Healy
(74) *Attorney, Agent, or Firm*—Oppenheimer Wolff & Donnelly LLP; Adam P. Kiedrowski

(57) ABSTRACT

Considerable manufacturing efficiency and flexibility is provided by configuring the lower surface of a chip carrier to include multiple holes specifically designed to receive coupling fibers. By appropriately positioning these holes, the coupling fibers can be aligned with necessary optical elements of optoelectronic chips carried by the chip carrier. Similarly, the opposite end of the fibers can be appropriately configured and positioned for coupling to waveguide structures or fiber optic structures which may be embedded in printed circuit boards. By utilizing an appropriately configured chip carrier, and related fibers, a signal transmission structure is achieved which effectively bridges the gap between a chip carrier and a related printed circuit board.

1 Claim, 2 Drawing Sheets

U.S. PATENT DOCUMENTS

2007/0085215 A1 4/2007 Budd et al. .................. 257/778
2007/0258676 A1 11/2007 Windover .................... 385/14
2007/0297713 A1 12/2007 Lu et al. ....................... 385/14

OTHER PUBLICATIONS

"Optical Interconnection Schemes Using Micro-Optic Connectors for Passive Packaging in Optical PCBs", Mu Hee Cho, Han Seo Cho, Sung Hwan Hwang, Hyo-Hoon Park, Kyung Rok Kim and Jongho Lee; 2005 Electronic Components and Technology Conference, pp. 1830-1834.

"High-Coupling-Efficiency Optical Interconnection Using a 90°-Bent Fiber Array Connector in Optical Printed Circuit Boards" Mu Hee Cho, Sung Hwan Hwang, Ha Seo Cho and Hyo-Hoon Park; *IEEE Photonics Technology Letters*, v17, n3, Mar. 2005.

* cited by examiner

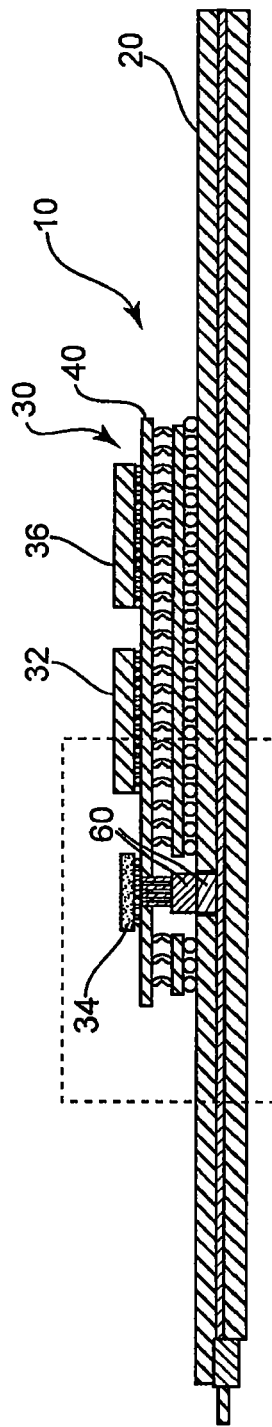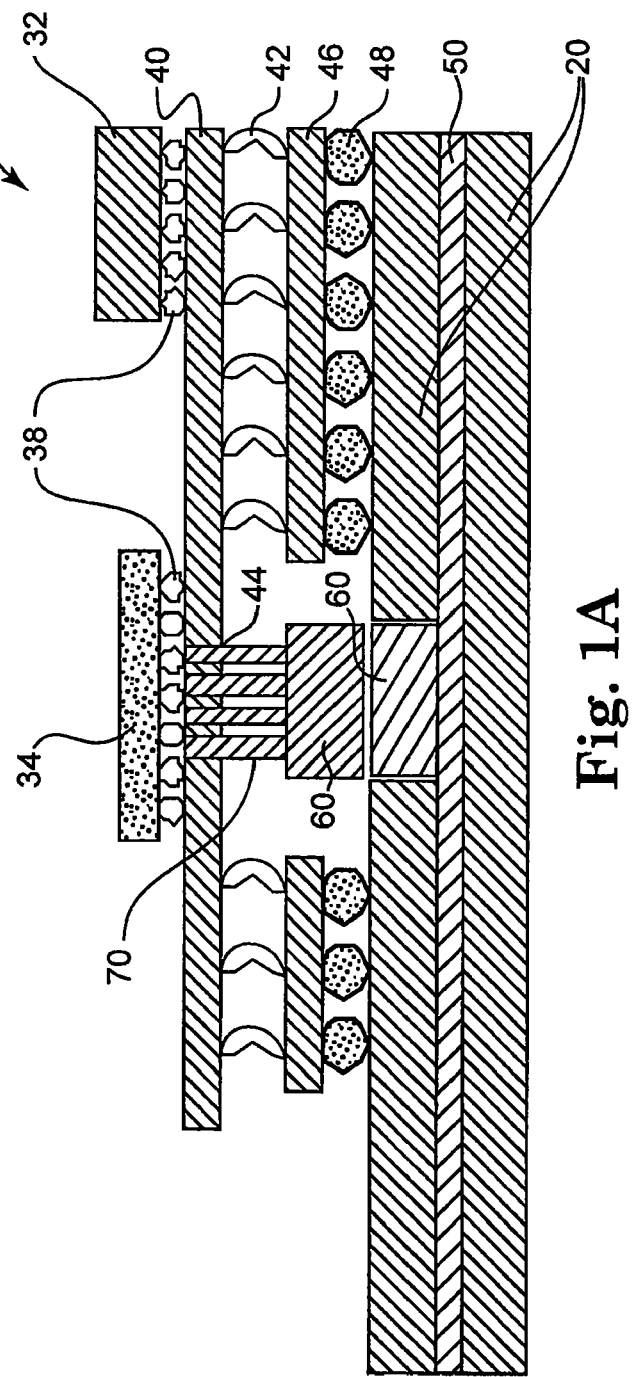

CHIP CARRIER PACKAGE WITH OPTICAL VIAS

FIELD OF THE INVENTION

The present invention relates to chip carrier structures which accommodate optoelectronic chips. More specifically, the present invention relates to a chip carrier structure which more easily provides an optical connection mechanism for coupling optoelectronic components to related optical signals carriers embedded or attached to circuit boards.

BACKGROUND OF THE INVENTION

With the increasing performance of processors and switching chips, a similar increase in bandwidth requirements for incoming and outgoing data also exists. In certain cases, electrical interconnects can provide bandwidth limitations for microelectronic chips. These limitations are a result of maximum electrical line density and maximum data rates per line. One potential solution to this higher bandwidth requirement is the use of optical components and optical communication connections. Simply stated, optical communications is capable of operating at higher speeds per line, and a higher line density. As such, higher bandwidth density is achievable using optical signals.

High density and high speed data is preferably made available at the top of a chip carrier, immediately adjacent to a processor. As such, this is the optimum location to place those components which convert data from electrical to optical signals and vice-versa. As recognized by those skilled in the art, this typically involves the placement of lasers or optical detectors at the top of the chip carrier, immediately adjacent the processor. This placement however creates a complication when attempting to communicate high speed optical signals from the top of the chip carrier to appropriate components in a related circuit board. For example, the printed circuit board may include embedded waveguides, or fiber optic interconnects which carry the optical signals to related components.

To achieve transmission of optical signals from the optoelectronic component to appropriate signal carrying structures, existing chip carriers typically include a window or lens on a bottom surface thereof. This lens or window is obviously aligned with the optoelectronic component, thus allowing optical signals to be transmitted from (or received at) the bottom side of the chip carrier. In this particular approach, two design complications exist: (1) the distance the optical signals must travel, and (2) appropriate alignment of the window with related optical structures. The distance to the circuit board creates issues due to the potential divergence of the optical signal, which leads to a limited signal strength and crosstalk between signals. Typical optoelectronic structures as applied in datacom applications are capable of transmitting signals approximately two millimeters or so while also achieving appropriate transmission performance. Naturally, the power level and signal strength may have some bearing on this distance. As also mentioned, alignment is an issue. Typical printed circuit boards do not require tight dimensional tolerances, thus the exact placement of components can vary somewhat. Unfortunately, the alignment of optical components necessarily requires tighter tolerances and more precision. Thus, the differences in these tolerances alone can cause misalignment.

In light of the above issues, a better approach to optical signal transfer is necessary for use in optoelectronic circuit assemblies. Such an approach will appropriately bridge the gap that will exist between optoelectronic components and signal carrying structures embedded within a printed circuit board.

BRIEF SUMMARY OF THE INVENTION

The present invention provides a chip carrier for optoelectronic circuits which includes structures for appropriate communication of optical signals. Generally speaking, the chip carrier package includes integrated optical interconnect elements which then allow much more flexibility when attempting to connect with related optical transmission structures. In this case, flexible optical fibers are used for these interconnect elements. More specifically, the chip carrier is configured to accommodate an optoelectronic chip as part of either a single chip module (SCM) or a multi-chip module (MCM) in order to increase the signal bandwidth density both to and from the chip. The chip carrier includes a housing for accommodating the optoelectronic chip, which necessarily includes appropriate electrical connections. In addition, the present invention includes flexible optical waveguide elements, or flexible fiber optic elements, which are allowed to protrude through holes in the chip carrier to accommodate optical communication. A butted or lensed coupling of the flexible waveguide elements to the optical elements of the optoelectronic chip allows for appropriate transmission thereto. In most instances, these waveguide elements will extend from the bottom surface of the chip carrier, thus easily allowing optical signals to be passed from the optoelectronic chips to related structures within a circuit board structure.

Many different circuit board structures exist which are capable of accommodating both electrical and optical signals. In many of these structures, an embedded or integral waveguide structure exists at some location for carrying appropriate optical signals. To provide appropriate interfaces, these waveguides may include coupling mechanisms such as reflecting elements. The present invention is capable of interfacing with many different connection methodologies, due to the use of flexible waveguide elements, as mentioned above. These waveguide elements can thus be coupled to multiple waveguide structures existing within the circuit board. For example, the flexible waveguide may simply extend downwardly from the chip carrier package and be butt-coupled to a coupling element on the top of the circuit board itself. Alternatively, in those instances where the waveguide extends horizontally within the circuit board (i.e., parallel with the bottom surface of the chip carrier and perpendicular to the direction the waveguide connecting elements extend) flexible waveguide elements are capable of being bent or aligned as necessary. In one embodiment, these connecting waveguide elements are capable of bending 90 degrees to provide signal transmission and coupling to the above-referenced horizontal waveguide structure.

As generally discussed above, the flexible optical waveguide elements, extending from the bottom surface of the chip carrier, allows coupling to many different structures. These flexible connecting elements also easily deal with any alignment inaccuracies that may exist due to relatively large circuit board tolerances. Stated alternatively, the flexible waveguide connecting elements can be curved or bent slightly to interface at an appropriate location on the circuit board.

As discussed above, it is an object of the present invention to provide an optoelectronic chip carrier capable of easily being aligned for appropriate coupling to circuit board structures. It is a further object of the present invention to bridge the gap between a chip carrier package, and the circuit board structure, thereby allowing efficient optical communication as desired.

BRIEF DESCRIPTION OF THE DRAWINGS

Further objects and advantages of the present invention can be seen by reading the following detailed description, in conjunction with the drawings in which:

FIG. 1 is a cross-sectional diagram illustrating one embodiment of the chip carrier of the present invention, with FIG. 1a being a close-up view of one section thereof.

DETAILED DESCRIPTION OF THE INVENTION

Figure 2:
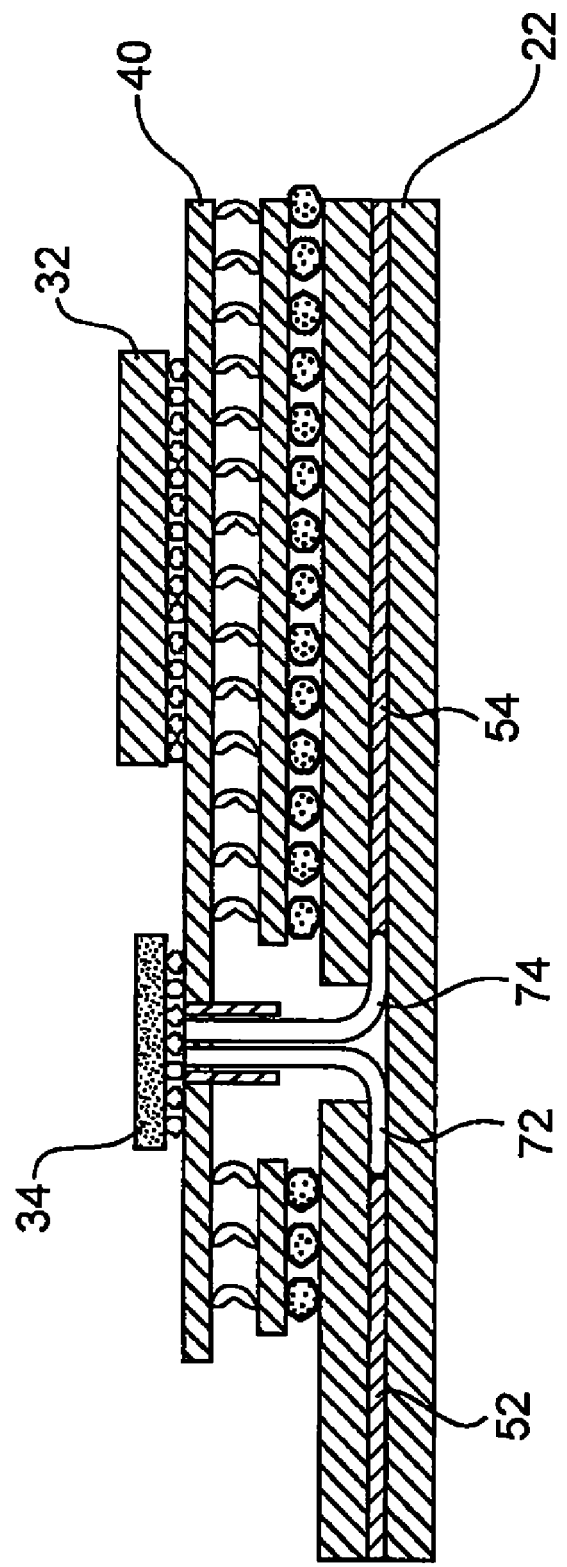
FIG. 2 is a cross-sectional view of a chip carrier illustrating an alternative connection to optical transmission components.

In an effort to provide significant flexibility during the manufacturing and assembly of optoelectronic systems, the present invention provides a mechanism to more easily interconnect optoelectronic elements to associated waveguides or fibers embedded in printed circuit boards. Generally speaking, the present invention approaches this problem by providing openings in the bottom surface of a chip carrier which are specifically configured to receive fibers for optical coupling.

Referring now to FIG. 1, one embodiment of this connection methodology is illustrated. Generally speaking, FIG. 1 is a cross-sectional diagram of a circuit assembly 10 which includes a printed circuit board 20 and a multi-chip module 30 attached thereto. Multi-chip module 30 includes a processor chip 32, an optoelectronic chip 34 and a related electrical chip 36 attached to a carrier 40. In this example, additional chips may exist on carrier 40 depending on the particular application. Similarly, the concepts of the present invention could be applied to a single chip module which includes only the optoelectronic chip 34. As is well understood, and as better shown in FIG. 1a, optoelectronic chip 34 and processor chip 32 are electrically connected to carrier 40 via a plurality of chip to carrier connections 38. Similarly, carrier 40 is connected to an interposer 46 via multiple carrier connections 42. Interposer 46 then accommodates appropriate connections to printed circuit board 20 via multiple interposer to board connections 48. Naturally, this connection scheme is fairly well understood and commonly utilized in integrated circuit technology, and can take many different forms depending upon the configuration of the particular circuit involved. Simply stated, these various interconnects allow for appropriate electrical connection to other components that may exist on printed circuit board 20, which are not shown in FIG. 1.

Printed circuit board 20 includes an embedded waveguide 50 which is specifically configured to carry optical signals to related components as necessary for overall system operations. In this particular example, waveguide 50 is illustrated as a single structure embedded within printed circuit board 20. In many circumstances, the circuit board will actually include multiple waveguides at different levels and different configurations, thus carrying optical signals in many different directions to and from multiple components.

To provide appropriate connection to waveguide 50, circuit assembly 10 includes a pair of optical connection mechanisms 60 which are specifically designed for coupling to waveguide 50. These types of connection mechanisms are fairly well known in the art and may include mirrors, prisms or appropriate optical components capable of directing optical signals in the desired directions.

To provide improved optical coupling between optoelectronic chip 34 and waveguide 50, the present invention provides a number of small holes in carrier 40, through which a plurality of flexible optical waveguide elements 70 are inserted. In one embodiment, these flexible optical waveguide elements 70 are appropriately sized fiber optic cables. While alternative structures are also possible, the description below will refer to these as "fibers" 70 with the understanding that similar optical signal carrier structures are also possible. As illustrated, carrier holes 44 are positioned immediately below optoelectronic chip 34, and are aligned during the fabrication process of chip carrier 40 to accommodate appropriate optical coupling with the related optical elements of optoelectronic chip 34 (not specifically shown). By configuring these openings to specifically receive fibers 70, more efficient coupling is achieved by allowing fibers 70 to bridge the gap existing between carrier 40 and printed circuit board 20. While FIGS. 1 and 2 both show separate vias 44 in carrier 40 for each fiber 70, alternative structures may exist, including larger vias to accommodate multiple fibers. Most importantly, some type of opening exists in carrier 40 to accommodate the fibers 70.

To help deal with alignment problems that may exist between elements of printed circuit board 20 and multi-chip module 30, fibers 70 are designed to be flexible. Generally speaking, the fibers can be appropriately directed or curved to any desired location for further optical coupling to waveguide elements, as necessary. As can be anticipated, alternative versions of flexible waveguide connecting elements 70 are also capable of bending or curving as necessary to provide the desired alignment.

One alternative connection methodology, exhibiting the manufacturing flexibility provided by the present invention is illustrated in FIG. 2. More specifically, FIG. 2 illustrates a first curved fiber 72 and a second curved fiber 74, each extending from holes 44 in carrier 40 to a first waveguide 52 and a second waveguide 54 embedded in printed circuit board 22. In this embodiment, first curved fiber 72 is configured to extend below carrier 40 and bend at 90 degrees to the left in order to optically couple with first waveguide structure 52. Similarly, optical coupling between optoelectronic chip 34 and second waveguide structure 54 is achieved by the placement of second curved fiber 74, which also includes a bend which is substantially equal to 90 degrees. As can be seen, by providing these fibers 70, 72, 74, extending through chip carrier 40 and onto appropriate components or structures in circuit board 20 provides the substantial ability to appropriately direct optical signals as needed.

While a preferred embodiment and an alternative embodiment are described above, the present invention is not intended to be limited to these particular embodiments. Rather, the invention is intended to cover all configurations and modifications coming within the scope and spirit of the following claim.

What is claimed is:

1. A chip carrier package for containing microelectronic circuits including an optoelectronic circuit, the chip carrier package comprising:

a chip carrier for accommodating the optoelectronic circuit having at least one electrical connector attachable to a circuit board;

a via in the chip carrier positioned adjacent an optical element of the optoelectronic circuit thus allowing access to the optical element from the opposite side of the chip carrier; and a flexible waveguide element positioned within the via and attached to the chip carrier in a position so as to be optically coupled to the optical element of the optoelectronic circuit, wherein the flexible waveguide element protrudes beyond the lower surface of the chip carrier in a substantially perpendicular orientation, the opposite end of the flexible waveguide element configured for optical coupling of the waveguide element to an optical communication element contained within the circuit board, wherein the optical communication element is oriented substantially perpendicular to the lower surface of the chip carrier.

* * * * *